United States Patent
Maekawa

(10) Patent No.: US 10,756,534 B2
(45) Date of Patent: Aug. 25, 2020

(54) INPUT/OUTPUT MODULE

(71) Applicant: DENSO WAVE INCORPORATED, Chita-gun, Aichi-pref. (JP)

(72) Inventor: Takaaki Maekawa, Aichi-pref (JP)

(73) Assignee: DENSO WAVE INCORPORATED, Aichi-Pref. (JP)

( * ) Notice: Subject to any disclaimer, the term of this patent is extended or adjusted under 35 U.S.C. 154(b) by 332 days.

(21) Appl. No.: 15/936,789

(22) Filed: Mar. 27, 2018

(65) Prior Publication Data

US 2018/0366944 A1    Dec. 20, 2018

(30) Foreign Application Priority Data

Jun. 19, 2017 (JP) ................... 2017-119841

(51) Int. Cl.
| | |
|---|---|
| *H02H 7/20* | (2006.01) |
| *H03K 19/0175* | (2006.01) |
| *G05B 19/05* | (2006.01) |
| *G05B 19/048* | (2006.01) |
| *H02H 3/20* | (2006.01) |
| *H02H 1/00* | (2006.01) |

(Continued)

(52) U.S. Cl.
CPC .............. *H02H 7/20* (2013.01); *G05B 19/048* (2013.01); *G05B 19/054* (2013.01); *H02H 3/207* (2013.01); *H03K 19/017581* (2013.01); *G05B 23/0275* (2013.01); *G05B 2219/1181* (2013.01); *H02H 1/0007* (2013.01); *H03K 5/24* (2013.01)

(58) Field of Classification Search
CPC ...... H02H 1/00; H02H 1/0007; H02H 1/0053; H02H 3/00; H02H 3/021; H02H 3/20; H02H 7/00; H02H 7/005; H02H 7/09; H02H 7/20; H03K 5/24; H03K 19/017581; G05B 19/017581; G05B 19/048; G05B 19/054; G05B 2219/1181; G05B 23/0275
See application file for complete search history.

(56) References Cited

U.S. PATENT DOCUMENTS 8,330,778 B2 * 12/2012 Song ...................... G09G 5/006
 345/207
2012/0001639 A1    1/2012 Mizoguchi et al.
(Continued)

FOREIGN PATENT DOCUMENTS

JP    2011-078165 A    4/2011

*Primary Examiner* — Matthew V Nguyen
(74) *Attorney, Agent, or Firm* — Oliff PLC

(57) ABSTRACT

An input/output module includes a control unit and a monitoring unit. The monitoring unit includes a series-connection body including three or more resistors, a comparator, a connection path, and a switch. One of inverting and non-inverting input terminals of the comparator serves as a monitoring terminal, and the other serves as a threshold terminal. Input voltage of the threshold terminal when the switch is turned off is set to a high-voltage-side threshold, and the input voltage when the switch is turned on is set to a low-voltage-side threshold. The control unit makes a diagnosis that an abnormality in which the power supply voltage falls outside of an operable voltage range or an abnormality in the monitoring unit has occurred, when logic of an output signal of the comparator is determined to be unchanged over a determination time that is a longer amount of time than a predetermined amount of time.

4 Claims, 8 Drawing Sheets

(51) Int. Cl.
  *G05B 23/02*   (2006.01)
  *H03K 5/24*    (2006.01)

(56) References Cited

U.S. PATENT DOCUMENTS

2018/0052434 A1* 2/2018 Maekawa .......... G05B 19/0423
2019/0179283 A1* 6/2019 Maekawa ............. G05B 19/05
2019/0310677 A1* 10/2019 Terasaki ................ G01R 31/40

* cited by examiner

| Vp | COMPARATOR | Vout |
|---|---|---|
| NORMAL | NORMAL | ⊓⊓⊓ |
| HIGH-VOLTAGE ABNORMALITY | NORMAL | STUCK AT H |
| LOW-VOLTAGE ABNORMALITY | NORMAL | STUCK AT L |
| NORMAL | STUCK-HIGH ABNORMALITY | STUCK AT H |
| NORMAL | STUCK-LOW ABNORMALITY | STUCK AT L |

INPUT/OUTPUT MODULE

CROSS-REFERENCE TO RELATED APPLICATION

This application is based on and claims the benefit of priority from earlier Japanese Patent Application No. 2017-119841, filed Jun. 19, 2017, the description of which is incorporated herein by reference.

BACKGROUND

Technical Field

The present disclosure relates to an input/output (I/O) module.

Related Art

An I/O module that performs communication among a plurality of external apparatuses is conventionally known. Hereafter, an example of the I/O module will be described. This example performs communication between a safety programmable logic controller (PLC) and an emergency stop switch. The safety PLC outputs operation commands to an industrial robot.

The I/O module includes a control unit that acquires an output signal of the emergency stop switch. The control unit then outputs a signal corresponding to the acquired signal to the safety PLC. When the signal corresponding to the output signal of the emergency safety switch is inputted to the safety PLC from the control unit, the safety PLC outputs an operation stop command to the robot.

Here, the control unit is capable of performing communication between the emergency stop switch and the safety PLC as a result of a power supply voltage that is supplied from a power supply falling within an operable voltage range. Therefore, to accurately transmit the signal outputted from the emergency stop switch to the safety PLC when the emergency stop switch outputs the signal, a configuration that monitors the power supply voltage to ensure that the power supply voltage is within the operable voltage range of the control unit is required.

Therefore, the I/O module includes a monitoring unit that monitors the power supply voltage that is supplied from the power supply to the control unit, to ensure that the power supply voltage is within the operable voltage range. For example, as the monitoring unit, a following configuration can be considered (refer to JP-A-2011-78165). That is, the configuration includes a plurality of comparators (such as two comparators) for monitoring the power supply voltage to ensure that the power supply voltage is within the operable voltage range.

As a result of this configuration, even if an abnormality occurs in one comparator, the other comparator is able to monitor the power supply voltage. Here, in cases in which an abnormality occurs in the monitoring unit, the power supply voltage cannot be monitored. Therefore, to ensure functional safety of the I/O module, a configuration in which the I/O module is provided with a second monitoring unit can be considered. The second monitoring unit monitors whether or not an abnormality has occurred in the monitoring unit.

In recent years, there has been a demand for smaller I/O modules. In this regard, when the I/O module includes, in addition to the monitoring unit, the second monitoring unit that monitors whether or not an abnormality has occurred in the monitoring unit, a problem occurs in that the physical size of the I/O module increases.

For example, when the above-described configuration that includes a plurality of comparators is used, the second monitoring unit is provided for each comparator. As a result, the increase in the number of constituent components is significant. The increase in physical size of the I/O module may also become significant. The above-described problem is not limited to the I/O module that performs communication between a safety PLC and an emergency stop switch, and is similarly possible in any I/O module that performs communication among a plurality of external apparatuses.

It is thus desired to provide an I/O module that is capable of suppressing increase in the number of constituent components.

SUMMARY

An exemplary embodiment of the present disclosure provides an I/O module that includes a control unit and a monitoring unit. The control unit performs communication between a first external apparatus and a second external apparatus as a result of a power supply voltage that is supplied from a power supply falling within an operable voltage range. The monitoring unit monitors the power supply voltage to ensure that the power supply voltage is within the operable voltage range. The monitoring unit includes: a series-connection body including three or more resistors; a comparator; a connection path; and a switch.

One end of the series-connection body is connected to a ground and the other end is connected to a constant-voltage power supply. The comparator includes an inverting input terminal and a non-inverting input terminal. One of the inverting input terminal and the non-inverting input terminal serves as a monitoring terminal to which the power supply voltage is inputted. The other of the inverting input terminal and the non-inverting input terminal serves as a threshold terminal to which a voltage at a connection point between any two adjacent resistors among the resistors is inputted.

The connection path is either of an electrical path that connects the ground and a connection point that is further on the ground side than the connection point that is connected to the threshold terminal, among the connection points between two adjacent resistors in the series-connection body including the resistors, and an electrical path that connects two connection points that are further on the ground side than the connection point that is connected to the threshold terminal, among the connection points between two adjacent resistors in the series-connection body including the resistors. The switch is provided on the connection path and is turned on and off every predetermined amount of time.

An input voltage of the threshold terminal when the switch is turned off is set to a high-voltage-side threshold that is an upper-limit value of the operable voltage range, and the input voltage of the threshold terminal when the switch is turned on is set to a low-voltage-side threshold that is a lower-limit value of the operable voltage range.

The control unit includes a diagnosing unit that makes a diagnosis that an abnormality in which the power supply voltage falls outside of the operable voltage range or an abnormality in the monitoring unit has occurred, when logic of an output signal of the comparator is determined to be unchanged over a determination time that is a longer amount of time than the predetermined amount of time.

The monitoring unit according to the exemplary embodiment monitors the power supply voltage that is supplied to the control unit from the power supply. The monitoring unit includes the series-connection body that includes three or more resistors, the comparator that has the monitoring terminal and the threshold terminal, the connection path, and the switch. For example, the monitoring terminal is the non-inverting input terminal (positive terminal) of the comparator, and the threshold terminal is the inverting input terminal (negative terminal) of the comparator.

When the switch is turned off, the output voltage of the constant voltage power supply that is divided by the resistors is inputted to the threshold terminal. The input voltage of the threshold terminal in this case is the high-voltage-side threshold that is the upper-limit value of the operable voltage range of the control unit.

Meanwhile, when the switch is turned on, a short circuit occurs, via the connection path, between the ground and the connection point that is further towards the ground side than the connection point that is connected to the threshold terminal, among the connection points between two adjacent resistors in the series-connection body including the resistors.

The input voltage of the threshold terminal when the short circuit occurs decreases from the input voltage when the switch is turned off, and is the low-voltage-side threshold that is the lower-limit value of the operable voltage range. Because the switch is turned on and off every predetermined amount of time, the input voltage of the threshold terminal changes between the low-voltage-side threshold and the high-voltage-side threshold every predetermined amount of time.

If the power supply voltage that is supplied to the control unit from the power supply is within the operable voltage range, when the input voltage of the threshold terminal of the comparator changes from either of the low-voltage-side threshold and the high-voltage-side threshold to the other, the logic of the output signal of the comparator is inverted in accompaniment with the change. Therefore, when the power supply voltage is within the operable voltage range, the logic of the output signal of the comparator is inverted every predetermined amount of time.

Conversely, when the power supply voltage falls outside of the operable voltage range, even if the input voltage of the threshold terminal changes from either of the low-voltage-side threshold and the high-voltage-side threshold to the other, the logic of the output signal of the comparator is not inverted in accompaniment with the change. Therefore, when an abnormality in which the power supply voltage falls outside of the operable voltage range occurs, the logic of the output signal of the comparator is unchanged over a longer amount of time than the predetermined amount of time that is the on/off switching cycle of the switch.

Even if the power supply voltage is within the operable voltage range, when an abnormality has occurred in the monitoring unit, the logic of the output signal of the comparator is unchanged over a longer amount of time than the predetermined amount of time that is the on/off switching cycle of the switch. For example, the abnormality in the monitoring unit includes an abnormality in which the drive state of the switch cannot be switched (stuck at on or off).

As described above, when an abnormality in which the power supply voltage falls outside of the operable voltage range or an abnormality in the monitoring unit occurs, the logic of the output signal of the comparator is unchanged over a longer amount of time than the predetermined amount of time.

In light of this, the diagnosing unit according to the exemplary embodiment makes a determination that an abnormality in which the power supply voltage falls outside of the operable voltage range or an abnormality in the monitoring unit has occurred, when the logic of the output signal of the comparator is determined to be unchanged over a determination time that is a longer amount of time than the predetermined amount of time.

According to the exemplary embodiment, both the power supply voltage and the monitoring unit can be subjected to an abnormality diagnosis by a simple configuration in which a single comparator is provided for a monitoring target. As a result, compared to a configuration in which two comparators are provided for a monitoring target, increase in the number of constituent components can be suppressed.

According to the exemplary embodiment, the comparator may be configured as a molded integrated circuit that includes therein the switch and a drive unit. The drive unit outputs, to the switch, a drive signal to turn on and off the switch every predetermined amount of time.

When foreign matter, such as dust, infiltrates the I/O module and attaches to the switch or the drive unit that outputs the drive signal of the switch, erroneous operation of the switch may occur. In addition, when noise is superimposed on the drive signal which turns the switch on and off, erroneous operation of the switch may occur.

When erroneous operation of the switch occurs, for example, regardless of abnormalities in the power supply voltage and the monitoring unit not actually having occurred, the logic of the output signal of the comparator remains unchanged over the determination time and the abnormality in the power supply voltage or the monitoring unit may not be accurately diagnosed.

In this regard, according to the exemplary embodiment, the switch and the drive unit are sealed in molding resin. Therefore, foreign matter does not easily infiltrate into the I/O module. As a result, attachment of foreign matter onto the switch and the drive unit can be prevented. Erroneous operation of the switch can be prevented.

Furthermore, according to the exemplary embodiment, because the switch and the drive unit are provided inside the comparator, for example, the switch and the drive unit can be placed closer together compared to a configuration in which the drive unit is provided outside of the comparator. As a result, noise is not easily superimposed on the drive signal and erroneous operation of the switch can be prevented.

According to the exemplary embodiment in which erroneous operation of the switch can be prevented, an abnormality in which the power supply voltage falls outside of the operable voltage range and an abnormality in the monitoring unit not being accurately diagnosed can be prevented.

According to the exemplary embodiment, the first external apparatus may be a programmable logic controller that outputs operation commands to a control-target apparatus. The second external apparatus may be a safety apparatus that outputs an emergency stop signal to make the control-target apparatus perform an emergency stop. The control unit may have a clock unit that acquires a logic inversion timing of the output signal of the comparator as a reference timing, and clocks an amount of time over which the logic of the output signal is continuously unchanged with the acquired reference timing as a computation-start timing.

The diagnosing unit may make a diagnosis that the abnormality has occurred when the amount of time clocked by the clock unit reaches the determination time. The control unit may interrupt communication between the programmable logic controller and the safety apparatus when the diagnosing unit makes the diagnosis that an abnormality has occurred. The programmable logic controller may output an operation stop command to the control-target apparatus when the emergency stop signal outputted from the safety apparatus is determined to be inputted via the control unit and when the control unit interrupts communication between the programmable logic controller and the safety apparatus.

The control unit may include an inversion determining unit and a filtering unit. The inversion determining unit determines that the logic of the output signal is temporarily inverted during a period from the reference timing until elapse of the predetermined amount of time. The filtering unit prevents a start timing and an end timing of a temporary logic inversion period of the output signal from being used as the computation-start timing for clocking by the clock unit, when the inversion determining unit determines that the output signal is temporarily inverted and the temporary logic inversion period of the output signal is determined to be equal to or shorter than a filter time that is a shorter amount of time than the predetermined amount of time.

According to the exemplary embodiment, when the programmable logic controller determines that the emergency stop signal that has been outputted from the safety apparatus is inputted to the programmable logic controller itself via the control unit, programmable logic controller outputs the operation stop command for the control-target apparatus, such as an industrial robot. As a result, safety of workers who are working in the periphery of the control-target apparatus is ensured.

Here, when an abnormality in which the power supply voltage falls outside of the operable voltage range occurs, the safety apparatus may be unable to transmit the emergency stop signal to the control-target apparatus via the control unit. Therefore, according to the exemplary embodiment, the control unit interrupts communication between the programmable logic controller and the safety apparatus when the diagnosing unit makes a diagnosis that an abnormality in which the power supply voltage falls outside of the operable voltage range or an abnormality in the monitoring unit has occurred.

When the programmable logic controller determines that the control unit has interrupted the communication between the safety apparatus and the programmable logic controller itself, the programmable logic controller outputs the operation stop command for the control-target apparatus. As a result, safety of the workers is ensured.

According to the exemplary embodiment, the clock unit acquires the logic inversion timing of the output signal of the comparator as the reference timing. The clock unit then clocks the amount of time over which the logic of the output signal is continuously unchanged, with the acquired reference timing as the computation-start timing. The diagnosing unit makes a diagnosis that an abnormality in which the power supply voltage falls outside of the operable voltage range or an abnormality in the monitoring unit has occurred when the amount of time clocked by the clock unit reaches the determination time.

During the period in which the switch is turned on and the input voltage of the threshold terminal is the low-voltage-side threshold, the actual power supply voltage that is supplied to the control unit may exceed the upper-limit value of the operable voltage range. During the period in which the input voltage is the low-voltage-side threshold, even if the power supply voltage that is inputted to the monitoring terminal exceeds the high-voltage-side threshold that corresponds to the upper-limit value, the logic of the output signal of the comparator is not inverted.

Therefore, when an abnormality occurs in which the actual power supply voltage exceeds the upper-limit value occurs during the period in which the input voltage is the low-voltage-side threshold, the diagnosis that an abnormality has occurred is made at a timing at which the determination time has elapsed from the reference timing acquired before the occurrence of the abnormality.

Here, noise may be temporarily superimposed on the power supply voltage that is inputted to the monitoring terminal, after the actual power supply voltage that is supplied to the control unit exceeds the upper-limit value during the period in which the input voltage is the low-voltage-side threshold.

In this case, a following situation may occur. That is, the power supply voltage that is inputted to the monitoring terminal may temporarily fall below the low-voltage-side threshold, regardless of the actual power supply voltage supplied to the control unit exceeding the upper-limit value during the period in which the input voltage is the low-voltage-side threshold. The logic of the output signal is inverted at the timing at which the power supply voltage falls below the low-voltage-side threshold. Therefore, this logic inversion timing is acquired as a new reference timing.

Subsequently, the logic of the output signal is again inverted at the timing at which the power supply voltage exceeds the low-voltage-side threshold. Therefore, this logic inversion timing is acquired as a new reference timing. The clock unit starts clocking again with the new reference timing as the computation-start timing. Therefore, the timing at which the amount of time clocked by the clock unit reaches the determination time becomes delayed.

As a result, the amount of time until the diagnosis that an abnormality has occurred is made after the actual power supply voltage exceeds the upper-limit value becomes long. The timing at which the control unit interrupts the communication between the programmable logic controller and the safety apparatus is delayed. As a result, the output timing of the operation stop command from the programmable logic controller to the control-target apparatus is delayed. This delay is undesirable in terms of ensuring the safety of the workers who are working in the periphery of the control-target apparatus.

Therefore, according to the exemplary embodiment, the inversion determining unit determines that the logic of the output signal is temporarily inverted during the period from the reference timing until the elapse of the predetermined amount of time. When the inversion determining unit determines that the logic is temporarily inverted, the filtering unit prevents the start timing and the end timing of the temporary logic inversion period of the output signal from being used as the computation-start timing for clocking by the clock unit, when the temporary logic inversion period of the output signal is determined to be equal to or shorter than the filter time that is a shorter amount of time than the predetermined amount of time.

According to the exemplary embodiment, the reference timing that has been acquired before the power supply voltage temporarily falls below the lower-limit value of the operable voltage range can be used as the computation-start timing. Therefore, the amount of time from when an abnormality in which the power supply voltage exceeds the upper-limit value of the operable voltage range occurs until the diagnosis that the abnormality has occurred is made can be prevented from becoming long.

A delay in the timing at which the communication between the programmable logic controller and the safety apparatus is interrupted can be prevented. As a result, a delay in the timing at which the programmable logic controller outputs the operation stop command to the control-target apparatus can be prevented. Furthermore, safety of the workers who are working in the periphery of the control-target apparatus can be ensured.

According to the exemplary embodiment, a delay in the timing at which communication is interrupted can be prevented even in cases in which, after the actual power supply voltage falls below the lower-limit value of the operable voltage range during the period in which the input voltage of the threshold terminal is the high-voltage-side threshold, the power supply voltage that is inputted to the monitoring target temporarily exceeds the high-voltage-side threshold as a result of superimposed noise.

DESCRIPTION OF THE EMBODIMENTS

First Embodiment

A first embodiment actualizing an I/O module of the present disclosure will hereinafter be described with reference to the drawings. The I/O module according to the present embodiment configures an industrial robot system that is used in an assembly system in a machine assembly plant or the like.

Figure 1:
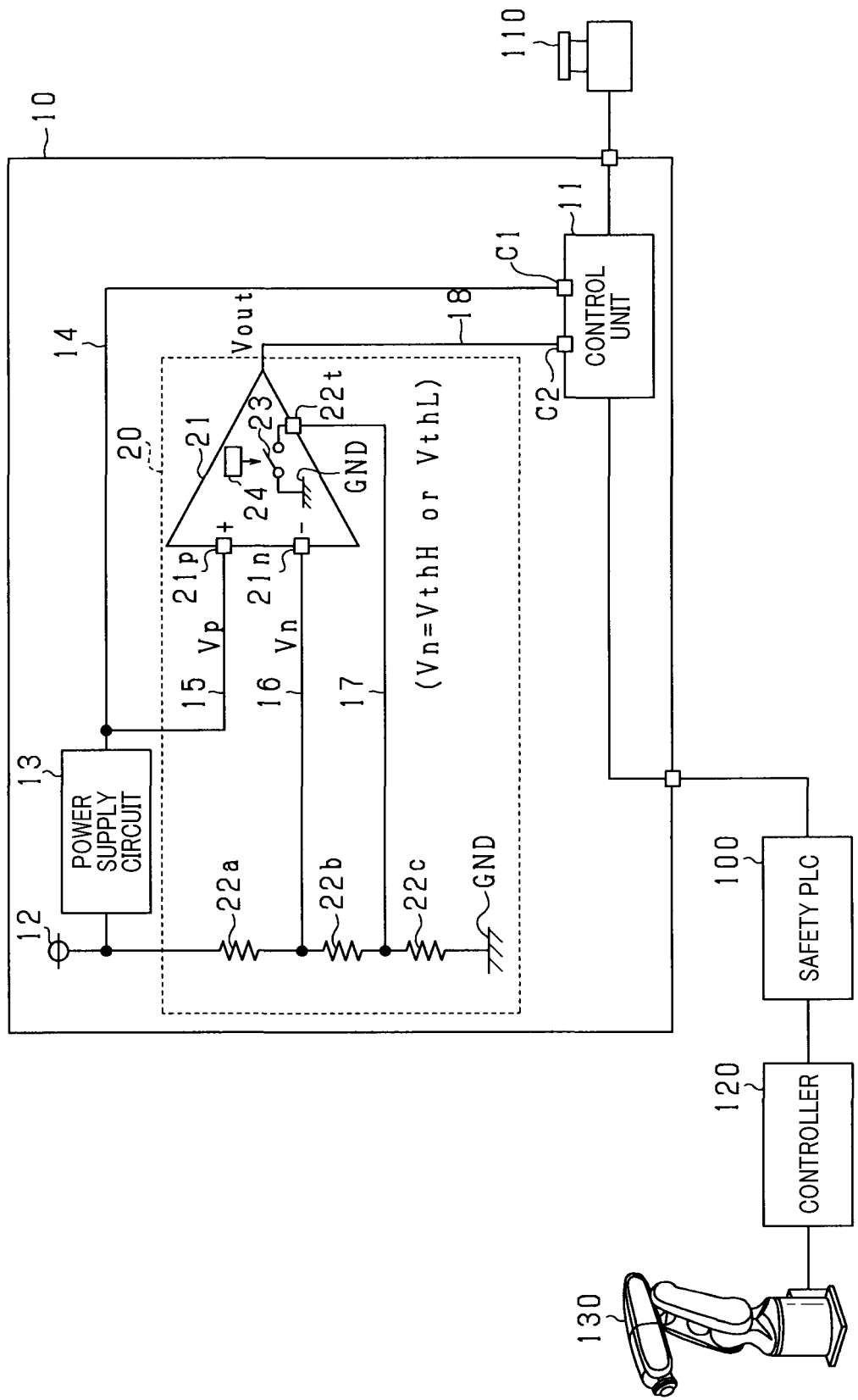
FIG. 1 is a diagram of an overall configuration of a system according to a first embodiment.

As shown in FIG. 1, the robot system includes an I/O module 10, a safety PLC 100, an emergency stop switch 110, a controller 120, and a robot 130. The emergency stop switch 110 serves as a safety apparatus. According to the present embodiment, the safety PLC 100 corresponds to a first external apparatus. The emergency stop switch 110 corresponds to a second external apparatus.

The safety PLC 100 is connected to the controller 120 by a cable. The controller 120 is connected to the robot 130 by a cable. The safety PLC 100 outputs operation commands for the robot 130 to the controller 120. The controller 120 controls the operation of the robot 130 based on the operation commands inputted from the safety PLC 100. For example, a six-axis vertically articulated robot or a horizontally articulated robot can be used as the robot 130. A high-order controller (not shown) is also connected to the safety PLC 100.

The safety PLC 100 and the emergency stop switch 110 are connected to the I/O module 10 by a communication line, such as a local area network (LAN). That is, according to the present embodiment, a remote I/O module that performs communication between the safety PLC 100 and the emergency stop switch 110 is used as the I/O module. When a worker presses the emergency stop switch 110, the emergency stop switch 110 outputs an emergency stop signal to make the robot 130 perform an emergency stop. Meanwhile, when the worker has not pressed the emergency stop switch 110, the emergency stop switch 110 does not output the emergency stop signal.

The I/O module 10 includes a control unit 11, a constant-voltage power supply 12, a power supply circuit 13, and a monitoring unit 20. The control unit 11 is mainly configured by a microcomputer. The control unit 11 performs a communication process in which the control unit 11 acquires the emergency stop signal outputted from the emergency stop switch 110 and outputs the acquired emergency stop signal to the safety PLC 100.

The constant-voltage power supply 12 is connected to an input side of the power supply circuit 13. A first terminal C1 of the control unit 11 is connected to an output side of the power supply circuit 13 by a power supply path 14. The power supply circuit 13 steps down the output voltage (such as 24 V) of the constant-voltage power supply 12 and supplies the stepped-down voltage to the control unit 11 as a power supply voltage Vp (such as 3.3 V). The control unit 11 is capable of performing communication between the safety PLC 100 and the emergency stop switch 110 as a result of the power supply voltage Vp falling within an operable voltage range of the control unit 110.

The safety PLC 100 outputs an operation stop command for the robot 130 to the controller 120 in cases in which the emergency stop signal outputted from the emergency stop switch 110 is determined to be inputted via the control unit 11, as well as in cases in which communication between the safety PLC 110 and the emergency stop switch 110 is determined to be interrupted by the control unit 11. When the operation stop command is determined to be inputted, the controller 120 stops the operation of the robot 130.

The monitoring unit 20 includes a comparator 21 and a serial-connection body including first to third resistors 22a to 22c. The constant-voltage power supply 12 is connected to a first end of the first resistor 22a. A second end of the first resistor 22a is connected to the ground GND with the second resistor 22b and the third resistor 22c therebetween. The power supply path 14 is connected to a non-inverting input terminal 21p of the comparator 21 by a first wiring 15.

As a result, the power supply voltage Vp is inputted to the non-inverting input terminal 21p. A connection point between the first resistor 22a and the second resistor 22b is connected to an inverting input terminal 21n of the comparator 21 by a second wiring 16. According to the present embodiment, the non-inverting input terminal 21p corresponds to a monitoring terminal and the inverting input terminal 21n corresponds to a threshold terminal.

The comparator 21 is a molded integrated circuit (IC) that includes a switch 23 and a drive unit 24 therein. The molded IC is configured such that the switch 23 and the drive unit 24 are sealed in a molding resin. For example, the switch 23 is an N-channel metal-oxide-semiconductor field-effect transistor (MOSFET). The drive unit 24 outputs a drive signal to a gate of the switch 23.

As a result, the switch 23 is turned on and off every predetermined amount of time TL. A test terminal 22t that is a terminal of the comparator 21 is connected to a first end of the switch 23. A second end of the switch 23 is connected to the ground GND. A connection point between the second resistor 22b and the third resistor 22c is connected to the test terminal 22t by a third wiring 17.

According to the present embodiment, resistance values of the first to third resistors 22a to 22c are set such that an input voltage Vn of the inverting input terminal 21n when the switch 23 is turned off is set to a high-voltage-side threshold VthH that is a same value as an upper-limit value (such as 5 V) of the operable voltage range. In addition, the resistance values of the first and second resistors 22a and 22b are set such that the input voltage Vn of the inverting input terminal 21n when the switch 23 is turned on is set to a low-voltage-side threshold VthL (such as 1 V) that is a same value as a lower-limit value of the operable voltage range.

According to the present embodiment, a path from the connection point between the second and third resistors 22b and 22c to the ground GND via the third wiring 17, the test terminal 22t, and the switch 23 corresponds to a connection path.

A diagnosis signal Vout that is an output signal of the comparator 21 is inputted to the control unit 11 through a signal line 18 and the second terminal of the control unit 11. The control unit 11 performs an abnormality diagnosis process based on the diagnosis signal Vout. In the abnormality diagnosis process, the control unit 11 makes a diagnosis regarding whether or not an abnormality in which the power supply voltage Vp falls outside of the operable voltage range or an abnormality in the monitoring unit 20 has occurred.

Figures 2, 3:
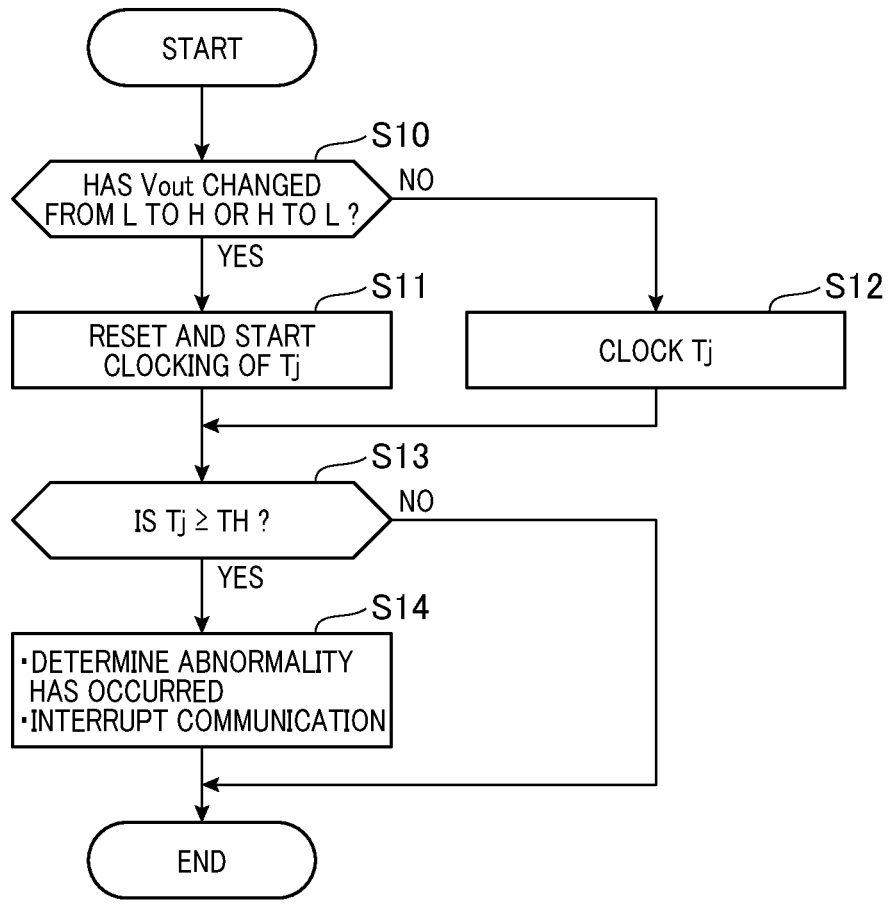
FIG. 2 is a flowchart of the steps in an abnormality diagnosis process.
FIG. 3 is a diagram of a relationship between respective states of a power supply voltage and a comparator, and a diagnosis signal.

FIG. 2 shows the steps in the abnormality diagnosis process. For example, the control unit 11 repeatedly performs the abnormality diagnosis process at a predetermined cycle.

At step S10, the control unit 11 determines whether or not a logic level (logic state) of the diagnosis signal Vout has changed from Low to High or from High to Low during the current processing cycle. The control unit 11 performs this process to acquire a logic inversion timing of the diagnosis signal Vout as a reference timing, and to use the acquired reference timing as a computation-start timing for clocking.

When determined that the logic level of the diagnosis signal Vout has changed at step S10, the control unit 11 proceeds to step S11. The control unit 11 resets an elapsed time Tj to zero and starts clocking of the elapsed time Tj. The elapsed time Tj is an amount of time elapsed from when the logic level of the diagnosis signal Vout is determined to have changed. Meanwhile, when determined that the logic level of the diagnosis signal Vout has not changed during the current processing cycle at step S10, the control unit 11 proceeds to step S12. The control unit 11 continues clocking the elapsed time Tj.

After completing the process at step S11 or step S12, the control unit 11 proceeds to step S13. The control unit 11 determines whether or not the elapsed time Tj has reached a determination time TH. According to the present embodiment, the determination time TH is set to be longer than the predetermined amount of time TL, which is the on/off switching cycle of the switch 23, and shorter than twice the predetermined amount of time TL.

Specifically, for example, the determination time TH may be set be longer than the predetermined amount of time TL and shorter than 1.5 times the predetermined amount of time TL. The control unit 11 performs the process at step S13 to determine whether or not an abnormality in which the power supply voltage Vp has fallen outside of the operable voltage range or an abnormality in the monitoring unit 20 has occurred.

The switch 23 is turned on and off every predetermined amount of time TL. Therefore, the input voltage Vn of the inverting input terminal 21n changes between the low-voltage-side threshold VthL and the high-voltage-side threshold VthH every predetermined amount of time TL. As a result, when the power supply voltage Vp is within the operable voltage range and an abnormality in the monitoring unit 20 has not occurred, the logic level of the diagnosis signal Vout is inverted every predetermined amount of time TL, as shown in FIG. 3.

In this regard, when a high-voltage abnormality in which the power supply voltage Vp exceeds the upper-limit value of the operable voltage range occurs, or when an abnormality in which the logic level of the diagnosis signal Vout is stuck at High occurs as an abnormality in the monitoring unit 20, even if the input voltage Vn of the inverting input terminal 21n changes from either of the low-voltage-side threshold VthL and the high-voltage-side threshold VthH to the other, the logic level of the diagnosis signal Vout remains stuck at High.

An abnormality in which the logic level of the diagnosis signal Vout is stuck at High may be at least either of an open fault in the switch 23 and an abnormality in which a short circuit occurs between the output terminal of the comparator 21 and the power supply of the comparator 21.

Meanwhile, when a low-voltage abnormality in which the power supply voltage Vp falls below the lower-limit value of the operable voltage range occurs, or an abnormality in which the diagnosis signal Vout is stuck at Low occurs as an abnormality in the monitoring unit 20, even if the input voltage Vn of the inverting input terminal 21n changes from either of the low-voltage-side threshold VthL and the high-voltage-side threshold VthH to the other, the logic level of the diagnosis signal Vout remains stuck at Low.

The abnormality in which the logic level of the diagnosis signal Vout is stuck at Low includes at least either of a short-circuit abnormality in the switch 23 and an abnormality in which a short circuit occurs between the output terminal of the comparator 21 and the ground GND.

Therefore, when an abnormality in which the power supply voltage Vp falls outside of the operable voltage range occurs or when an abnormality in the monitoring unit 20 occurs, the logic level of the diagnosis signal Vout is unchanged over a longer amount of time than the predetermined amount of time TL that is the on/off switching cycle of the switch 23. The process at step S13 is provided in light of the foregoing.

When determined that the elapsed time Tj has reached the determination time TH at step S13, the control unit 11 proceeds to step S14. The control unit 11 determines that an abnormality in which the power supply voltage Vp falls outside of the operable voltage range or an abnormality in the monitoring unit 20 has occurred. Then, the control unit 11 interrupts communication between the safety PLC 100 and the emergency stop switch 110.

As a result, the safety PLC 100 determines that the communication between the safety PLC 100 itself and the emergency stop switch 110 has been interrupted by the control unit 11 and outputs an operation stop command for the robot 130 to the controller 120. As a result, operation of the robot 130 is stopped.

Figure 4:
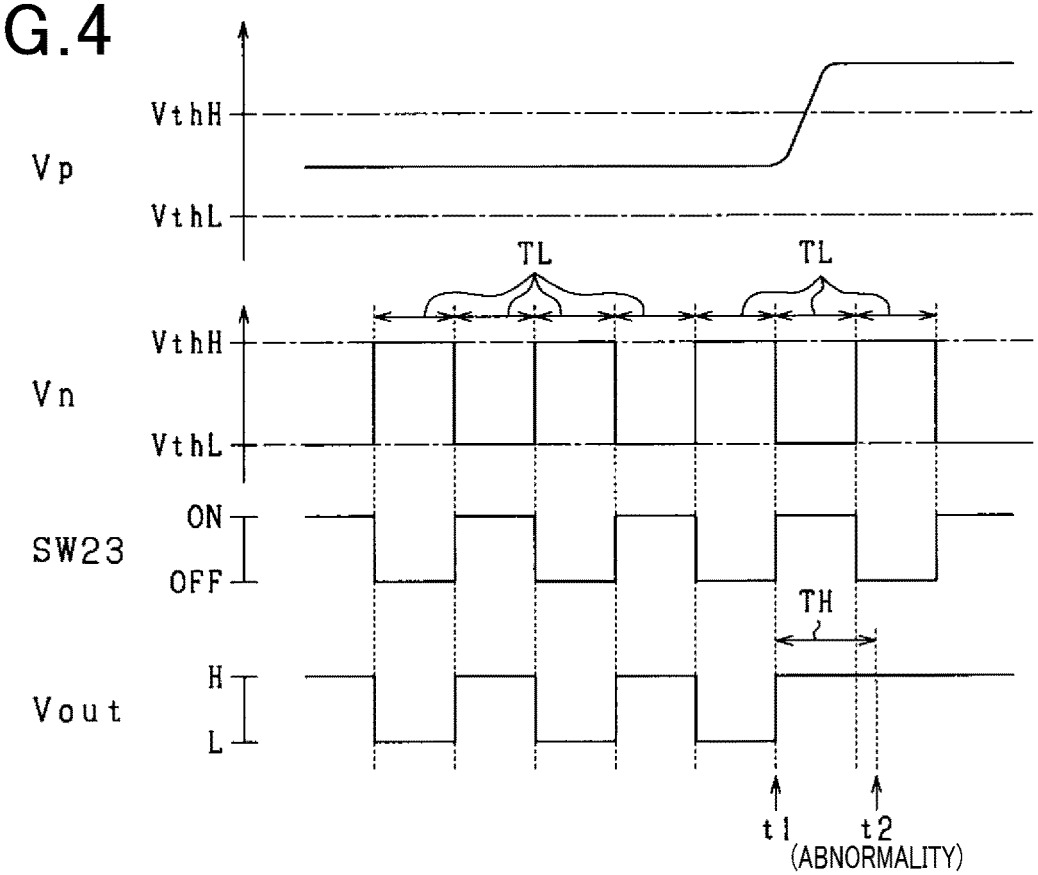
FIG. 4 is a time chart of an example of abnormality diagnosis when the power supply voltage exceeds a high-voltage-side threshold.

An abnormality diagnosis that is made when the power supply voltage Vp exceeds the high-voltage-side threshold VthH in a case in which an abnormality has not occurred in the monitoring unit 20 will be described with reference to FIG. 4. FIG. 4 shows transitions of the power supply voltage Vp, the input voltage Vn, a drive state of the switch 23, and the diagnosis signal Vout.

During a period before time t1, the power supply voltage Vp is within the operable voltage range. Therefore, the logic level of the diagnosis signal Vout is inverted every predetermined amount of time TL, which is the on/off switching cycle of the switch 23.

At time t1, the switch 23 is turned on and the logic level of the diagnosis signal Vout is inverted to High. Subsequently, a high-voltage abnormality in which the power supply voltage Vp exceeds the high-voltage-side threshold VthH that is the upper-limit value of the operable voltage range occurs. Therefore, the logic level of the diagnosis signal Vout is not inverted and remains High over a period from time t1 to time t2 at which the predetermined amount of time TL elapses. As a result, with time t1 as the reference timing, the elapsed time Tj during which the logic level of the diagnosis signal Vout remains High is determined to become the determination time TH at time t2. Consequently, the control unit 11 makes a diagnosis that an abnormality has occurred.

Figure 5:
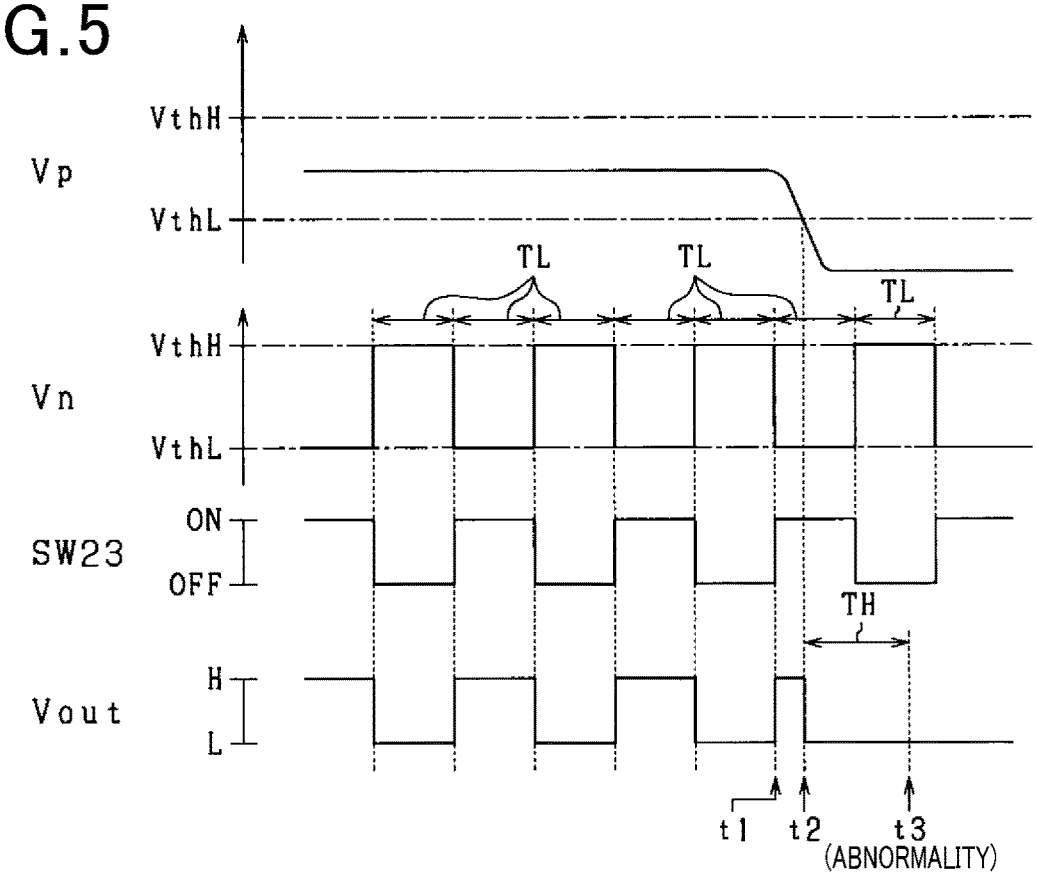
FIG. 5 is a time chart of an example of abnormality diagnosis when the power supply voltage falls below a low-voltage-side threshold.

Next, an abnormality diagnosis that is made when the power supply voltage Vp falls below the low-voltage-side threshold VthL will be described with reference to FIG. 5. FIG. 5 corresponds to FIG. 4, described above.

At time t1, the switch 23 is turned on and the logic level of the diagnosis signal Vout is inverted to High. Subsequently, at time t2, a low-voltage abnormality in which the power supply voltage Vp falls below the low-voltage-side threshold VthL that is the lower-limit value of the operable voltage range occurs. Therefore, the logic level of the diagnosis signal Vout is inverted to Low at time t2. With time t2 as the reference timing, the elapsed time Tj during which the logic level of the diagnosis signal Vout remains at Low is determined to become the determination time TH at time t3. Consequently, the control unit 11 makes a diagnosis that an abnormality has occurred.

According to the present embodiment described above, the following effects can be achieved.

The monitoring unit 20 includes the series-connection body including the first to third resistors 22a to 22c, the comparator 21, and the switch 23. One end of the series-connection body including the first to third resistors 22a to 22c is connected to the ground GND. The other end is connected to the constant-voltage power supply 12.

The power supply circuit 13 is connected to the non-inverting input terminal 21p of the comparator 21 by the first wiring 15 and the power supply path 14. The connection point between the first and second resistors 22a and 22b is connected to the inverting input terminal 21n. The ground GND is connected to the connection point between the second and third resistors 22b and 22c by the third wiring 17, the test terminal 22t, and the switch 23.

In this configuration, when determined that the amount of time over which the logic level of the diagnosis signal Vout that is the output signal of the comparator 21 continuously does not change has reached the determination time TH, the control unit 11 determines that an abnormality in which the power supply voltage Vp falls outside of the operable voltage range or an abnormality in the monitoring unit 20 has occurred.

As a result of the configuration, both the power supply voltage VP and the monitoring unit 20 can be subjected to an abnormality diagnosis by a simple configuration in which a single comparator is provided for a monitoring target. As a result, compared to a configuration in which two comparators are provided for a monitoring target, increase in the number of constituent components of the I/O module 10 can be suppressed.

The comparator 21 is configured as a molded IC that includes therein the switch 23 and the drive unit 24. The drive unit 24 outputs a drive signal to the switch 23 to turn on and off the switch 23 every predetermined amount of time TL. Therefore, infiltration of foreign matter, such as dust, into the I/O module 10 in a plant can be prevented.

As a result, attachment of foreign matter onto the switch 23 and the drive unit 24 can be prevented. Erroneous operation of the switch 23 and the drive unit 24 can be prevented. Furthermore, because the switch 23 and the drive unit 24 are provided inside the comparator 21, the switch 23 and the drive unit 24 can be placed in close proximity. As a result, noise is not easily superimposed on the drive signal and erroneous operation of the switch 23 can be prevented.

According to the present embodiment in which erroneous operation of the switch 23 can be prevented, diagnosis regarding an abnormality in which the power supply voltage Vp falls outside of the operable voltage range and an abnormality in the monitoring unit 20 not being able to be made can be reliably prevented.

The drive unit 24, rather than the control unit 11, turns on and off the switch 23. Therefore, even in cases in which a control unit that has high processing performance cannot be used as the control unit 11, the drive unit 24 can take on the load of the process for turning on and off the switch 23. As a result, the control unit 11 can promptly interrupt communication between the safety PLC 100 and the emergency stop switch 110 when a diagnosis that an abnormality has occurred is made. Safety of the workers can be ensured.

Second Embodiment

Figure 6:
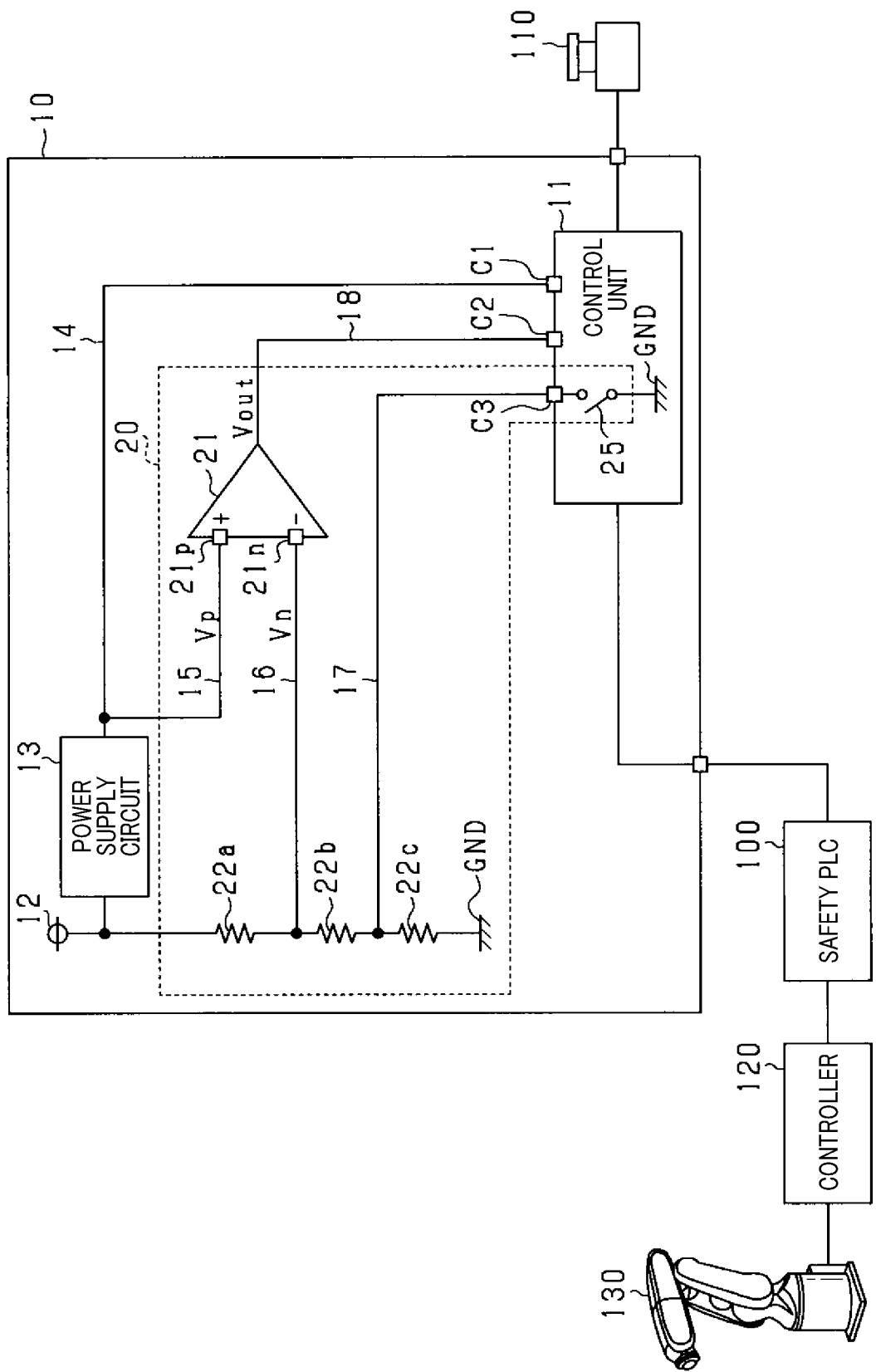
FIG. 6 is a diagram of an overall configuration of a system according to a second embodiment.

A second embodiment will be described below with reference to the drawings, mainly focusing on the differences with the first embodiment. As shown in FIG. 6, according to the present embodiment, a switch 25 that is turned on and off to change the input voltage Vn of the inverting input terminal 21n is provided inside the control unit 11, rather than the comparator 21. In FIG. 6, configurations that are identical to the configurations shown in FIG. 1, described above, are given the same reference numbers for convenience.

A third terminal C3 of the control unit 11 is connected to the connection point between the second resistor 22b and the third resistor 22c by the third wiring 17. The ground GND is connected to the third terminal C3 with the switch 25 therebetween. The control unit 11 turns on and off the switch 25 every predetermined amount of time TL.

According to the above-described embodiment, effects based on the effects according to the first embodiment can be achieved.

Third Embodiment

Figure 7:
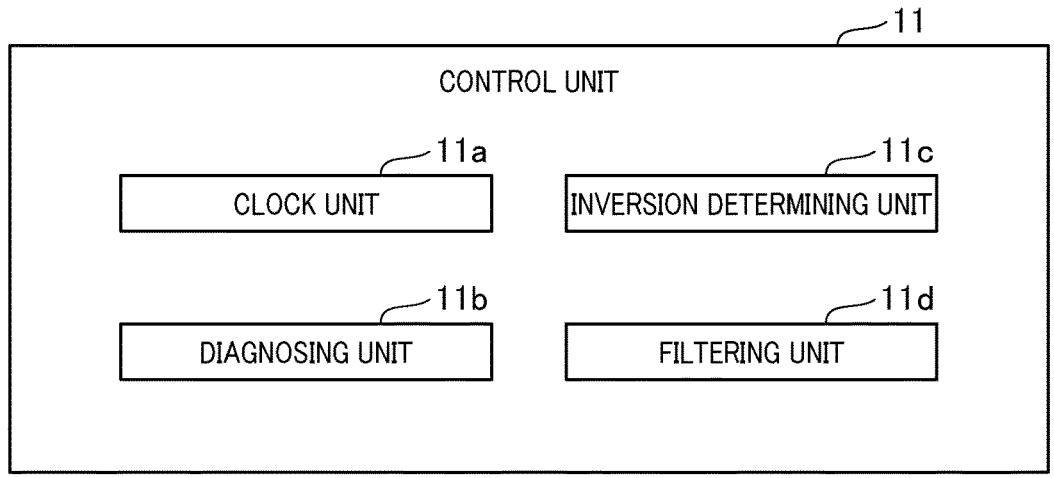
FIG. 7 is a diagram of functions of a control unit according to a third embodiment.

A third embodiment will be described below with reference to the drawings, focusing on the differences with the first embodiment. FIG. 7 shows the control unit 11 according to the present embodiment. The control unit 11 includes a clock unit 11a, a diagnosing unit 11b, an inversion determining unit 11c, and a filtering unit 11d.

As described above regarding steps S10 and S11 in FIG. 2, the clock unit 11a acquires a logic inversion timing of the diagnosis signal Vout as the reference timing and clocks the amount of time over which the logic level of the diagnosis signal Vout does not change as the elapsed time Tj, using the acquired reference timing as the computation-start timing.

As described above regarding steps S13 and S14 in FIG. 2, the diagnosing unit 11b makes a diagnosis that an abnormality in which the power supply voltage Vp falls outside of the operable voltage range or an abnormality in the monitoring unit 20 has occurred when the clocked elapsed time Tj is determined to have reached the determination time TH.

The inversion determining unit 11c determines whether or not the logic level of the diagnosis signal Vout is temporarily inverted during a period from the acquired reference timing until the elapse of the predetermined amount of time TL.

When the inversion determining unit 11c determines that the logic level of the diagnosis signal Vout is temporarily inverted, the filtering unit 11d prevents use of a start timing and an end timing of the temporary logic inversion period of the diagnosis signal Vout as the computation-start timing for clocking by the clock unit 11a, when the temporary logic inversion period of the diagnosis signal Vout is determined to be equal to or less than a filter time Tf that is an amount of time shorter than the predetermined amount of time TL.

For example, the filter time TL may be set to half the amount of time of the predetermined amount of time TL or less. The inversion determining unit 11c and the filtering unit 11d are provided to prevent delay in the timing at which a diagnosis that an abnormality has occurred is made, in cases in which noise is temporarily superimposed on the power supply voltage Vp after the occurrence of a high-voltage abnormality or a low-voltage abnormality.

Figure 8:
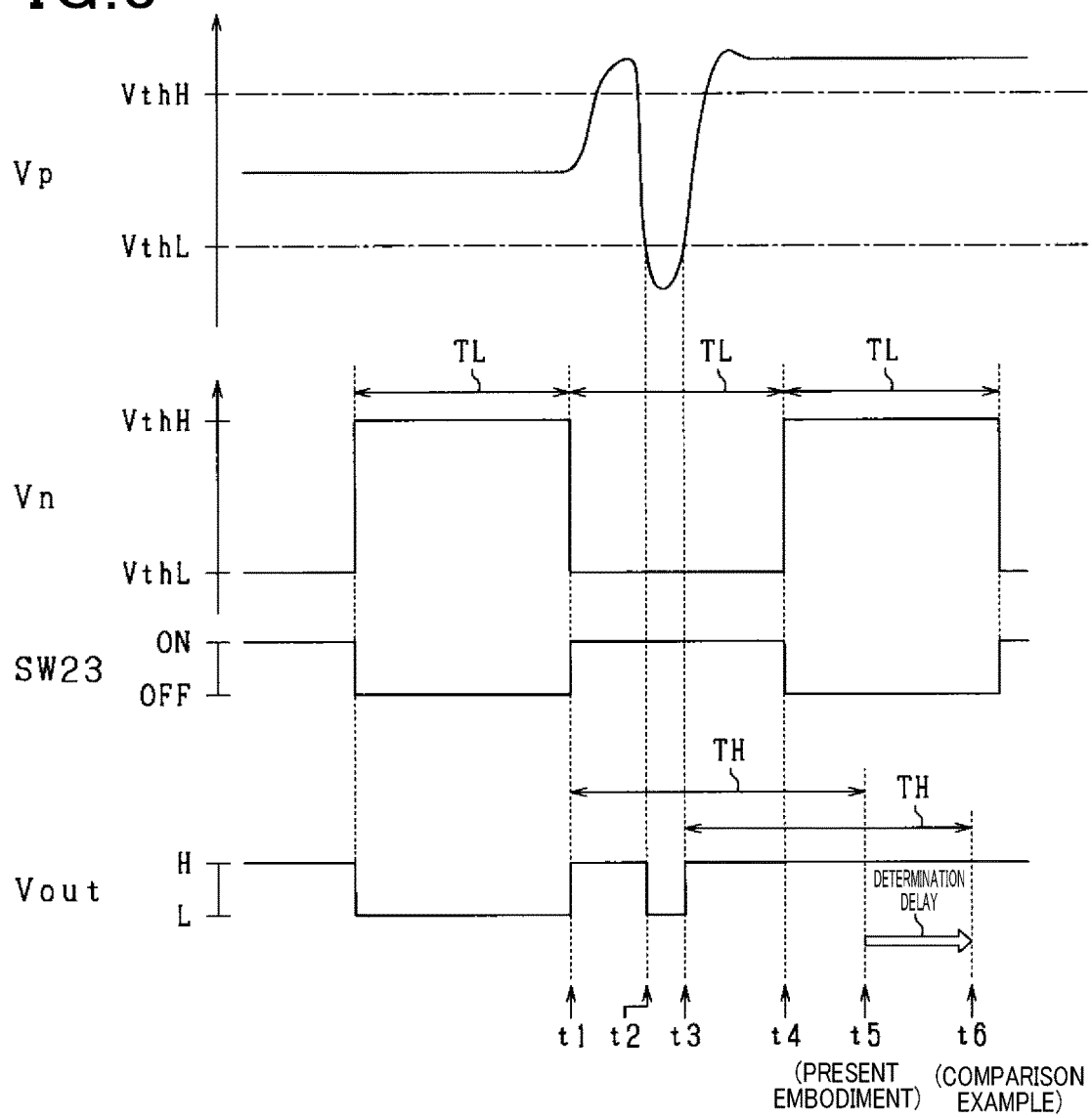
FIG. 8 is a time chart of an example of abnormality diagnosis when the power supply voltage exceeds the high-voltage-side threshold.

The case in which noise is superimposed on the power supply voltage Vp after the occurrence of a high-voltage abnormality will be described with reference to FIG. 8. In the example shown in FIG. 8, an abnormality in the monitoring unit 20 has not occurred. FIG. 8 corresponds to FIG. 4, described above.

First, a comparison example will be described. The comparison example is a configuration in which the inversion determining unit 11c and the filtering unit 11d are eliminated from the configuration according to the present embodiment.

At time t1, the logic level of the diagnosis signal Vout is inverted to High as a result of the switch 23 being switched to on. Therefore, time t1 is acquired as the reference timing that serves as the computation-start timing for the elapsed time Tj. From time t1 to time t4, the switch 23 is turned on and the input voltage Vn of the inverting input terminal 21n is set to the low-voltage-side threshold VthL. After time t1, a high-voltage abnormality in which the power supply voltage Vp exceeds the high-voltage-side threshold VthH occurs.

Subsequently, from time t2 to time t3, regardless of the occurrence of the high-voltage abnormality, noise is temporarily superimposed on the power supply voltage Vp and the power supply voltage Vp temporarily falls below the low-voltage-side threshold VthL. Because the power supply voltage Vp temporarily falls below the low-voltage-side threshold VthL at time t2, the logic level of the diagnosis signal Vout is inverted to Low. As a result, time t2 is acquired as a new reference timing.

Subsequently, at time t3 when the power supply voltage Vp exceeds the low-voltage-side threshold VthL, the logic level of the diagnosis signal Vout is again inverted to High. As a result, time t3 is acquired as a new reference timing. The clock unit 11a starts clocking again at time t3 that is the new reference timing. Therefore, the timing at which the diagnosing unit 11b determines that the elapsed time Tj clocked by the clock unit 11a has reached the determination time TH is delayed to time t6, rather than time t5.

The delay time t5 to t6 is a period that is identical to the period from time t1 to time t3. As a result of the delay in the determination timing of the diagnosing unit 11b, the timing at which the control unit 11 interrupts the communication between the safety PLC 100 and the emergency stop switch 110 is delayed. As a result, the output timing of the operation stop command from the safety PLC 100 to the robot 130 is delayed.

Here, according to the present embodiment, the inversion determining unit 11c and the filtering unit 11d are provided. Time t1 at which the logic level of the diagnosis signal Vout is inverted to High is acquired as the reference timing. Subsequently, during the period from time t1 to time t4 at which the predetermined amount of time TL elapses, the inversion determining unit 11c determines that the logic level of the diagnosis signal Vout is temporarily inverted to Low from time t2 to time t3.

When the inversion determining unit 11c determines that the logic level of the diagnosis signal Vout is temporarily inverted, the filtering unit 11d determines that the temporary logic inversion period (t2 to t3) of the diagnosis signal Vout is equal to or shorter than the filter time Tf that is shorter than the predetermined amount of time TL. As a result, time t2 that is the start timing of the temporary logic inversion period of the diagnosis signal Vout and time t3 that is the end timing thereof are not used as the computation-start timing for clocking by the clock unit 11a.

As a result, the reference timing t1 acquired before time t2 at which the power supply voltage Vp temporarily falls below the low-voltage-side threshold VthL can be used as the computation-start timing for clocking. Consequently, a diagnosis that an abnormality has occurred can be made at time t5 at which the determination time TH elapses from time t1.

Figure 9:
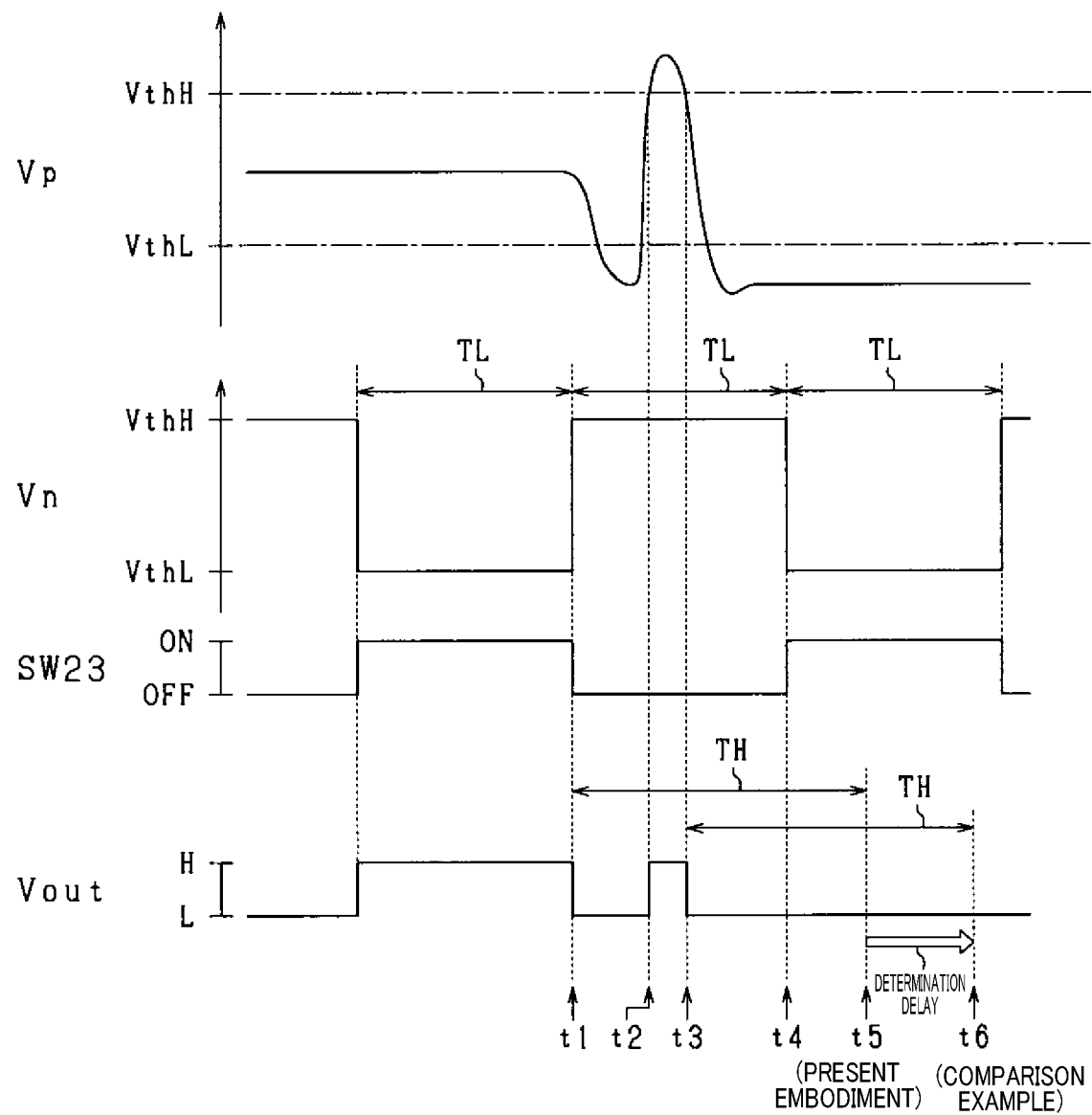
FIG. 9 is a time chart of an example of abnormality diagnosis when the power supply voltage falls below the low-voltage-side threshold.

The case in which noise is superimposed on the power supply voltage Vp after the occurrence of a low-voltage abnormality will be described with reference to FIG. 9. In the example shown in FIG. 9, an abnormality in the monitoring unit 20 has not occurred. FIG. 9 corresponds to FIG. 8, described above.

First, a comparison example will be described. At time t1, the logic level of the diagnosis signal Vout is inverted to Low as a result of the switch 23 being switched to off. Therefore, time t1 is acquired as the reference timing that serves as the computation-start timing for the elapsed time Tj. From time t1 to time t4, the switch 23 is turned off and the input voltage Vn of the inverting input terminal 21n is set to the high-voltage-side threshold VthH. After time t1, a low-voltage abnormality in which the power supply voltage Vp falls below the low-voltage-side threshold VthL occurs.

Subsequently, from time t2 to time t3, regardless of the occurrence of the low-voltage abnormality, noise is temporarily superimposed on the power supply voltage Vp and the power supply voltage Vp temporarily exceeds the high-voltage-side threshold VthH. Because the power supply voltage Vp exceeds the high-voltage-side threshold VthH at time t2, the logic level of the diagnosis signal Vout is inverted to High. As a result, time t2 is acquired as a new reference timing.

Subsequently, at time t3 when the power supply voltage Vp falls below the high-voltage-side threshold VthH, the logic level of the diagnosis signal Vout is again inverted to Low. As a result, time t3 is acquired as a new reference timing. The clock unit 11a starts clocking again at time t3 that is the new reference timing. Therefore, the timing at which the diagnosing unit 11b determines that the elapsed time Tj clocked by the clock unit 11a has reached the determination time TH is delayed to time t6, rather than time t5.

The delay time t5 to t6 is a period that is identical to the period from time t1 to time t3. As a result of the delay in the determination timing of the diagnosing unit 11b, the timing at which the control unit 11 interrupts the communication between the safety PLC 100 and the emergency stop switch 110 is delayed. As a result, the output timing of the operation stop command from the safety PLC 100 to the robot 130 is delayed.

Here, according to the present embodiment, time t1 at which the logic level of the diagnosis signal Vout is inverted to Low is acquired as the reference timing. Subsequently, during the period from time t1 to time t4 at which the predetermined amount of time TL elapses, the inversion determining unit 11c determines that the logic level of the diagnosis signal Vout is temporarily inverted to High from time t2 to time t3.

When the inversion determining unit 11c determines that the logic level of the diagnosis signal Vout is temporarily inverted to High, the filtering unit 11d determines that the temporary logic inversion period (t2 to t3) of the diagnosis signal Vout is equal to or shorter than the filter time Tf that is shorter than the predetermined amount of time TL. As a result, neither time t2 that is the start timing of the temporary logic inversion period of the diagnosis signal Vout nor time t3 that is the end timing thereof are used as the computation-start timing for clocking by the clock unit 11a.

As a result, the reference timing t1 acquired before time t2 at which the power supply voltage Vp temporarily exceeds the high-voltage-side threshold VthH can be used as the computation-start timing for clocking. Consequently, a diagnosis that an abnormality has occurred can be made at time t5 at which the determination time TH elapses from time t1.

According to the present embodiment described above, a delay in the timing of the diagnosis that an abnormality has occurred can be prevented. Therefore, a delay in the timing at which the control unit 11 interrupts the communication between the safety PLC 100 and the emergency stop switch 110 can be prevented. As a result, a delay in the timing at which the safety PLC 100 outputs the operation stop command to the controller 120 can be prevented. Furthermore, safety of the workers who are working in the periphery of the robot 130 can be ensured.

Other Embodiments

The above-described embodiments may be modified as follows.

Figure 10:
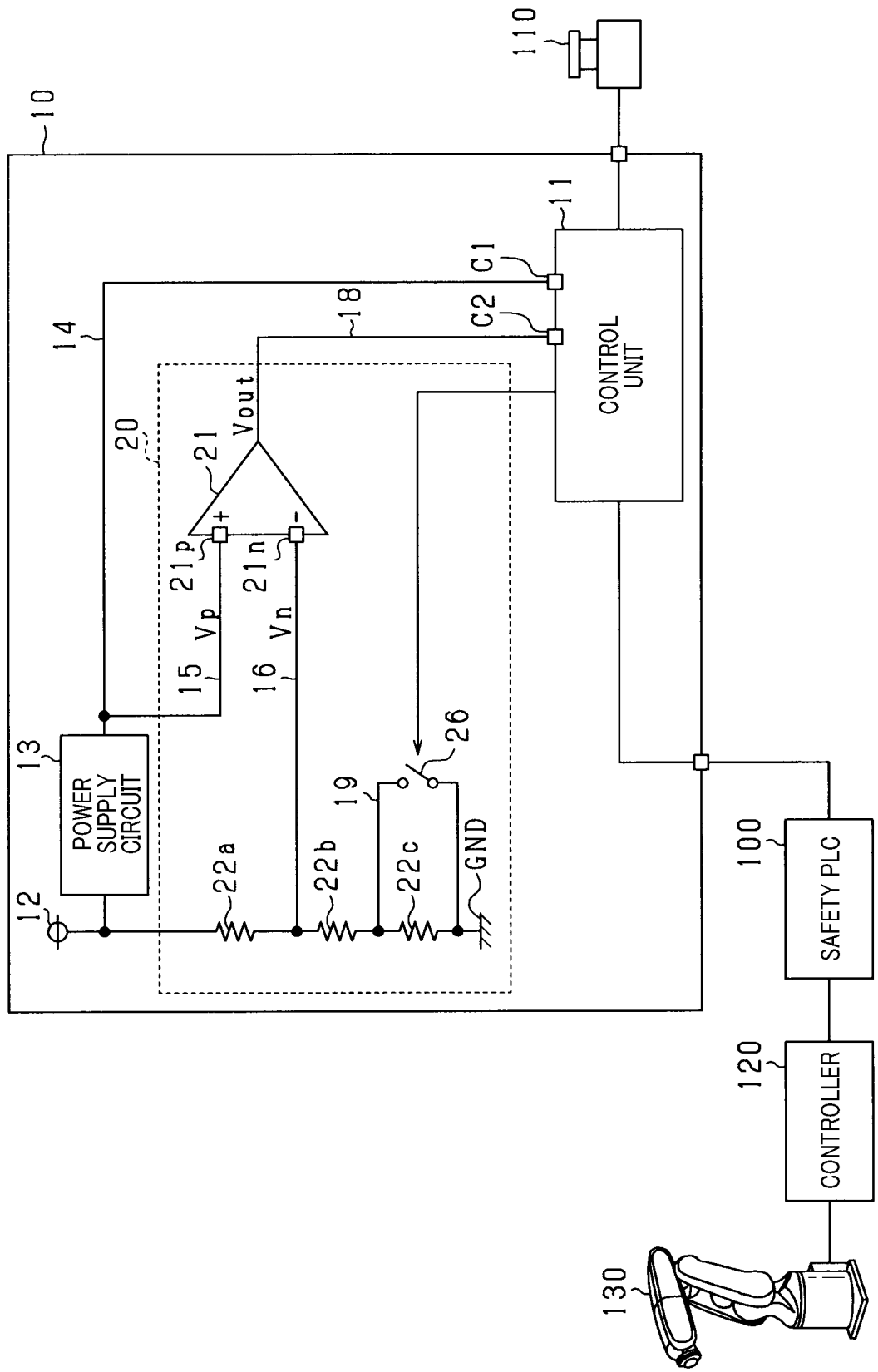
FIG. 10 is a diagram of an overall configuration of a system according to another embodiment.

As shown in FIG. 10, a switch 26 may be provided outside of the comparator 21 and the control unit 11, inside the I/O module 10. In FIG. 10, configurations that are identical to those shown in FIG. 6, described above, are given the same reference numbers for convenience.

A first end of a fourth wiring 19 corresponding to a connection path is connected to the first end of the third resistor 22c. A second end of the fourth wiring 19 is connected to the second end of the third resistor 22c. The switch 26 is provided on the fourth wiring 19. FIG. 10 shows an example in which the control unit 11 turns on and off the switch 26. However, the configuration is not limited thereto and may be such that the switch 26 is turned on and off by a processing unit other than the control unit 11 inside the I/O module 10.

Figure 11:
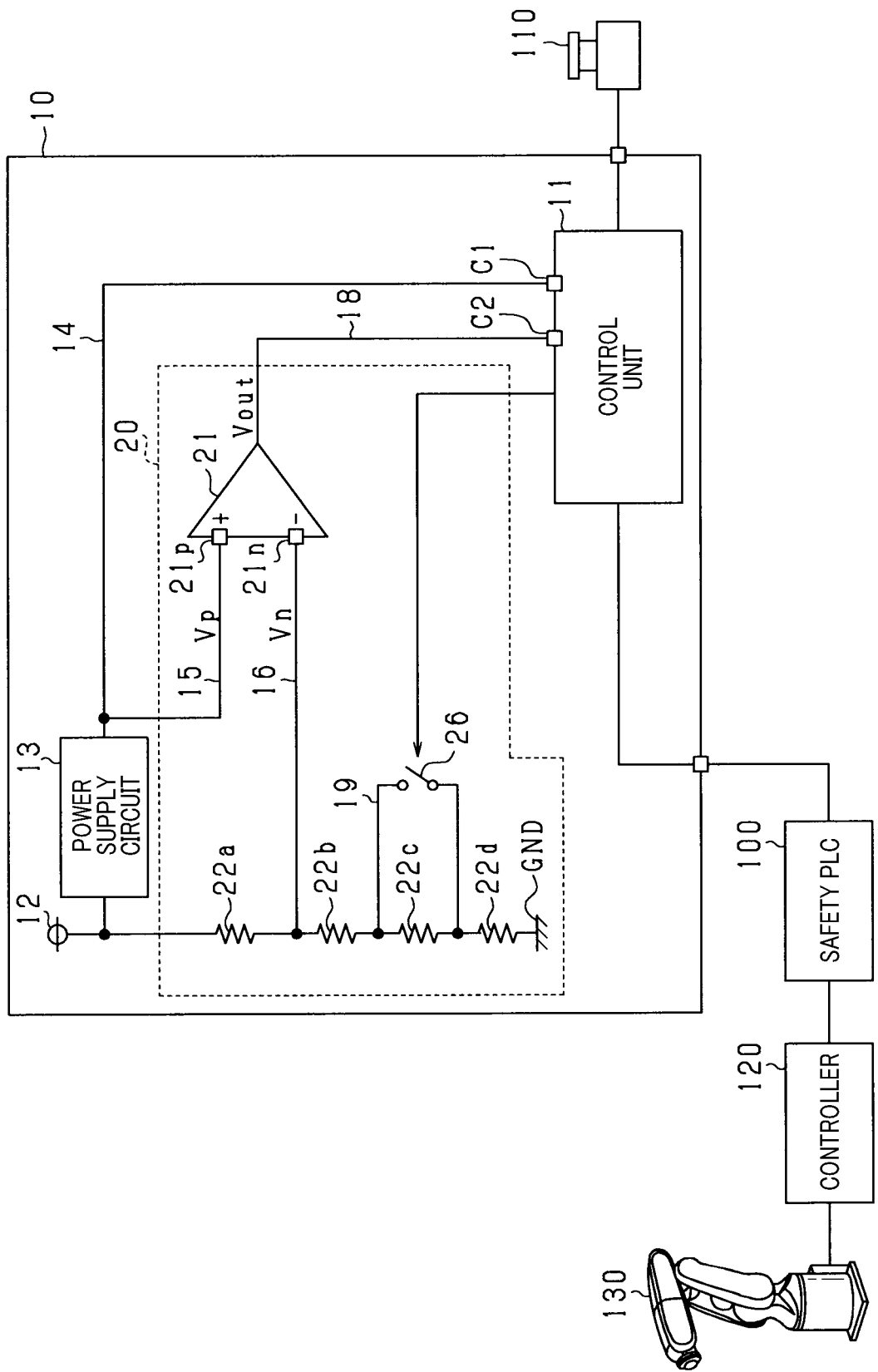
FIG. 11 is a diagram of an overall configuration of a system according to another embodiment.

The number of resistors that are provided in the monitoring unit 20 is not limited to three, and may be four or more. FIG. 11 shows an example in which the monitoring unit 20 includes a series-connection body including first to fourth resistors 22a to 22d that are four resistors. In FIG. 11, configurations that are identical to those shown in FIG. 6, described above, are given the same reference numbers for convenience.

The non-inverting input terminal 21p may be connected to the connection point between the first resistor 22a and the second resistor 22b. The inverting input terminal 21n may be connected to the power supply path 14.

The determination time may be set to an amount of time that is longer than twice the predetermined amount of time TL.

The external apparatuses that are connected to the I/O module are not limited to the emergency stop switch and the safety PLC, and may be other apparatuses. In addition, the safety apparatus connected to the I/O module is not limited to the emergency stop switch and, for example, may be an enabling switch or a light curtain.

A control-target apparatus of the safety PLC is not limited to the robot and, for example, may be a belt conveyor.

According to the above-described embodiments, the number of first external apparatuses, such as the emergency stop switch, that are connected to the I/O module is one. However, the number of first external apparatuses is not limited to one and may be two or more. In addition, the number of second external apparatuses, such as the safety PLC, that are connected to the I/O module is not limited to one and may be two or more.

What is claimed is:
1. An input/output module comprising:
a control unit that performs communication between a first external apparatus and a second external apparatus as a result of a power supply voltage that is supplied from a power supply falling within an operable voltage range; and
a monitoring unit that monitors the power supply voltage to ensure that the power supply voltage is within the operable voltage range,
the monitoring unit including
a series-connection body including three or more resistors, of which one end is connected to a ground and the other end is connected to a constant-voltage power supply,
a comparator including an inverting input terminal and a non-inverting input terminal, one of the inverting input terminal and the non-inverting input terminal serving as a monitoring terminal to which the power supply voltage is inputted, the other of the inverting input terminal and the non-inverting input terminal serving as a threshold terminal to which a voltage at a connection point between any two adjacent resistors among the resistors is inputted,
a connection path that is either of an electrical path that connects the ground and a connection point that is further on the ground side than the connection point that is connected to the threshold terminal, among the connection points between two adjacent resistors in the series-connection body including the resistors, and an electrical path that connects two connection points that are further on the ground side than the connection point that is connected to the threshold terminal, among the connection points between two adjacent resistors in the series-connection body including the resistors, and a switch that is provided on the connection path and is turned on and off every predetermined amount of time, an input voltage of the threshold terminal when the switch is turned off being set to a high-voltage-side threshold that is an upper-limit value of the operable voltage range, and the input voltage of the threshold terminal when the switch is turned on being set to a low-voltage-side threshold that is a lower-limit value of the operable voltage range, and the control unit including a diagnosing unit that makes a diagnosis that an abnormality in which the power supply voltage falls outside of the operable voltage range or an abnormality in the monitoring unit has occurred, when logic of an output signal of the comparator is determined to be unchanged over a determination time that is a longer amount of time than the predetermined amount of time.

2. The input/output module according to claim 1, wherein: the comparator is configured as a molded integrated circuit that includes therein the switch and a drive unit that outputs, to the switch, a drive signal to turn on and off the switch every predetermined amount of time.

3. The input/output module according to claim 2, wherein: the first external apparatus is a programmable logic controller that outputs operation commands to a control-target apparatus;

the second external apparatus is a safety apparatus that outputs an emergency stop signal to make the control-target apparatus perform an emergency stop;

the control unit has a clock unit that acquires a logic inversion timing of the output signal of the comparator as a reference timing, and clocks an amount of time over which the logic of the output signal is continuously unchanged with the acquired reference timing as a computation-start timing;

the diagnosing unit makes a diagnosis that the abnormality has occurred when the amount of time clocked by the clock unit reaches the determination time;

the control unit interrupts communication between the programmable logic controller and the safety apparatus when the diagnosing unit makes the diagnosis that an abnormality has occurred;

the programmable logic controller outputs an operation stop command to the control-target apparatus when the emergency stop signal outputted from the safety apparatus is determined to be inputted via the control unit and when the control unit interrupts communication between the programmable logic controller and the safety apparatus; and the control unit includes an inversion determining unit that determines that the logic of the output signal is temporarily inverted during a period from the reference timing until elapse of the predetermined amount of time, and a filtering unit that prevents a start timing and an end timing of a temporary logic inversion period of the output signal from being used as the computation-start timing for clocking by the clock unit, when the inversion determining unit determines that the output signal is temporarily inverted and the temporary logic inversion period of the output signal is determined to be equal to or shorter than a filter time that is a shorter amount of time than the predetermined amount of time.

4. The input/output module according to claim 1, wherein: the first external apparatus is a programmable logic controller that outputs operation commands to a control-target apparatus;

the second external apparatus is a safety apparatus that outputs an emergency stop signal to make the control-target apparatus perform an emergency stop;

the control unit has a clock unit that acquires a logic inversion timing of the output signal of the comparator as a reference timing, and clocks an amount of time over which the logic of the output signal is continuously unchanged with the acquired reference timing as a computation-start timing;

the diagnosing unit makes a diagnosis that the abnormality has occurred when the amount of time clocked by the clock unit reaches the determination time;

the control unit interrupts communication between the programmable logic controller and the safety apparatus when the diagnosing unit makes the diagnosis that an abnormality has occurred;

the programmable logic controller outputs an operation stop command to the control-target apparatus when the emergency stop signal outputted from the safety apparatus is determined to be inputted via the control unit and when the control unit interrupts communication between the programmable logic controller and the safety apparatus; and the control unit includes an inversion determining unit that determines that the logic of the output signal is temporarily inverted during a period from the reference timing until elapse of the predetermined amount of time, and a filtering unit that prevents a start timing and an end timing of a temporary logic inversion period of the output signal from being used as the computation-start timing for clocking by the clock unit, when the inversion determining unit determines that the output signal is temporarily inverted and the temporary logic inversion period of the output signal is determined to be equal to or shorter than a filter time that is a shorter amount of time than the predetermined amount of time.

* * * * *